United States Patent [19]
Noble et al.

[11] Patent Number: 5,980,091
[45] Date of Patent: Nov. 9, 1999

[54] METHOD OF SYNTHESIZING SYNCHRONIZED CIRCUIT MODULES IN AN INTEGRATED CIRCUIT CHIP

[75] Inventors: Robert Lee Noble, San Diego; Steven James Collins, Lake Forest, both of Calif.

[73] Assignee: Unisys Corporation, Blue Bell, Pa.

[21] Appl. No.: 08/753,140

[22] Filed: Nov. 20, 1996

[51] Int. Cl.$^6$ ................................................. G06F 15/00
[52] U.S. Cl. ............................................ 364/488; 395/551
[58] Field of Search .................................... 395/551, 558, 395/559; 364/488, 489, 490, 491

[56] References Cited

U.S. PATENT DOCUMENTS

| | | | |
|---|---|---|---|
| 5,095,454 | 3/1992 | Huang | 364/578 |
| 5,426,591 | 6/1995 | Ginetti et al. | 364/489 |
| 5,521,837 | 5/1996 | Frankle et al. | 364/491 |
| 5,726,902 | 3/1998 | Mahmood et al. | 364/489 |

*Primary Examiner*—Dennis M. Butler
*Attorney, Agent, or Firm*—Charles J. Fassbender; Mark T. Starr; Steven R. Petersen

[57] ABSTRACT

An integrated circuit chip is fabricated as several circuit modules that are synchronized with a clock signal, by the following steps. Initially, a hardware description language is used to describe a functional behavior for a first module on the chip which generates an intermodule signal, and describe a functional behavior for a second module on the chip which processes the intermodule signal. Thereafter, a slow circuit embodiment of the first module is synthesized with port timing constraints which permit the intermodule signal to be generated in twice the cycle time $T_{CY}$ of the clock signal, and a slow circuit embodiment of the second module is synthesized with port timing constraints which permit the intermodule signal to be processed in twice the cycle time of the clock. Then, a timing analysis program is run on the slow circuit embodiment of the first and second modules to thereby obtain a first delay $\Delta_1$ in which the intermodule signal is actually generated, and obtain a second delay $\Delta_2$ in which the intermodule signal is actually processed. Subsequently, a fast circuit embodiment of the first module is synthesized which generates the intermodule signal within a delay of $(T_{CY})(\Delta_1)\div(\Delta_1+\Delta_2)$ and a fast circuit embodiment of the second module is synthesized which processes the intermodule signal within a delay of $(T_{CY})(\Delta_2)\div(\Delta_1+\Delta_2)$.

12 Claims, 7 Drawing Sheets

Figure 1

```
            nextCmqState[~CMQ_RTRY_WAIT_1] = 1'b1;
            end (cmqNoResp[cmq_entry]):
            nextCmqState[ CMQ_ERROR_ACK] = 1'b1;

(cmqRespError[cmq_entry]):
            nextCmqState[~CMQ_ERROR_RESP] = 1'b1;

( !cmqRespGood[cmq_entry] &
          !cmqRespRetry[cmq_entry] &
          !cmqNoResp[cmq_entry] &
          !cmqRespError[cmq_entry]):
                next CmqState[~CMQ_WAIT_RESP] = 1'b1;
        endcase

(currentCmqState[~CMQ_RTRY_WAIT_1]):
        // 2 clocks for rcnt update followed by cmqOverRcnt update
        nextCmqState[~CMQ_RTRY_WAIT_2] = 1'b1;

(currentCmqState[~CMQ_RTRY_WAIT_2]):
        begin                    // retry count exceeded, go assert error
        if (cmqOverRcnt[cmq_entry])
            if (regCmqRetryLastRequested[cmq_entry])
                nextCmqState[~CMQ_ERROR_RCNT] = 1'b1;
            else              // One last time to set bus tags
                begin
                cmqRetryLastRequestedNext[cmq_entry] = 1'b1;
                nextCmqState[~CMQ_WAIT_RESP] = 1'b1;
                end
        else
            if (!cmqOverStretchCnt[cmq_entry] &&
                cmqOverBoCnt[cmq_entry])
                begin
                // retry backoff count exceeded, stretch count not.
                // (Don't want to wait if stretch.)
                // Load backoff down counter, wait before next send
                cmqLoadDcnt[cmq_entry] = 1;
                nextCmqState[~CMQ_WAIT_DCNT] = 1'b1;
                end
            else                    // go try again
                nextCmqState[~CMQ_WAIT_RESP] = 1'b1;
        end

(currentCmqState[~CMQ_WAIT_DCNT]):
        if (cmqWaitDcnt[cmq_entry])
            nextCmqState[~CMQ_WAIT_DCNT] = 1'b1;
        else
            nextCmqState[~CMQ_WAIT_RESP] = 1'b1;

(currentCmqState[~CMQ_ERROR_RCNT]):
        // Wait until error is latched
        if (cmqErrDone[cmq_entry])
            nextCmqState[~CMQ_ERROR_SEND] = 1'b1;
        else
            nextCmqState[~CMQ_ERROR_RCNT] = 1'b1;
```

```
(instance (rename I1 "AUCORE/reqout_inst/U5045")(viewRef NETLIST1(cellRef BUF(libraryRef H4C_EDIF_EXTLIB)))
(instance (rename I2 "AUCORE/queues_inst/U6658")(viewRef NETLIST1(cellRef INV2(libraryRef H4C_EDIF_EXTLIB)))
(instance (rename I3 "AUCORE/queues_inst/LrcqScmInState1/dff1")(viewRef NETLIST1(cellRef DFFMX1A(libraryRe
(instance (rename I4 "AUCORE/pst_inst/CmqReqInSelect/dff1")(viewRef NETLIST1(cellRef DFFMX4A(libraryRef H4
(instance (rename I5 "AUCORE/bufLOAD/U2708")(viewRef NETLIST1(cellRef INVB(libraryRef H4C_EDIF_EXTLIB)))
(instance (rename I6 "AUCORE/BT_control/U2157")(viewRef NETLIST1(cellRef INV4(libraryRef H4C_EDIF_EXTLIB)))
(instance (rename I7 "AUCORE/BT_control/U1816")(viewRef NETLIST1(cellRef INVB(libraryRef H4C_EDIF_EXTLIB)))
(instance (rename I8 "AUCORE/BT_control/U1392")(viewRef NETLIST1(cellRef AO121H(libraryRef H4C_EDIF_EXTLIB
```

Figure 6A

```
(net (rename N268 "AUCORE/BT_control/n3381")(joined (portRef E1(instanceRef I149))
     (portRef E1 (instanceRef I9))
     (portRef E1 (instanceRef I124))
     (portRef E1 (instanceRef I137))
     (portRef E1 (instanceRef I117))
     (portRef E1 (instanceRef I129))
     (portRef E1 (instanceRef I107))
     (portRef X  (instanceRef I187))
))
(net (rename N269 "AUCORE/BT_control/n3379")(joined (portRef E1(instanceRef I104))
     (portRef E1 (instanceRef I126))
     (portRef E1 (instanceRef I98))
     (portRef E1 (instanceRef I146))
     (portRef E1 (instanceRef I142))
     (portRef E1 (instanceRef I118))
     (portRef E1 (instanceRef I103))
     (portRef X  (instanceRef I183))
))
```

METHOD OF SYNTHESIZING SYNCHRONIZED CIRCUIT MODULES IN AN INTEGRATED CIRCUIT CHIP

BACKGROUND OF THE INVENTION

This invention relates to methods for synthesizing an integrated circuit chip as several circuit modules which are synchronized with a clock signal, and which are intercoupled by intermodule signals that are generated and processed in different modules within a single clock cycle.

In the prior art, various hardware description languages have been developed for use in synthesizing integrated circuit chips. One example of such a hardware description language is the language called Verilog. Using such a language, the functional behavior of an integrated circuit chip can be specified by an engineer; and that functional behavior can then be sent as an input to a circuit synthesizer program which in turn generates circuitry on a chip that performs the specified behavior.

With a hardware description language, the functional behavior for an entire chip can be described as a single module. However, as the number of transistors on a chip increases, describing the chip as a single module becomes impractical. Synthesizing a chip as a single module which contains over a million transistors can take several weeks to run. This problem is avoided by partitioning a chip into multiple modules which are synchronized with a clock signal, and by synthesizing each module separately.

However, when the functional behavior of a chip is partitioned into multiple modules, then a new problem inherently occurs. Due to the partitioning, a large number of intermodule signals will arise which are generated in one module and processed in one or more different modules. In a practical chip, thousands of these intermodule signals can exist; and, in order to synthesize the circuitry for any one module, timing constraints must be specified for all ports on which the intermodule signals enter or exit that module.

Since all of the modules in an actual chip together can generate and process thousands of intermodule signals, the task of specifying the timing constraints properly for all of the intermodule ports is horrendous. If the timing constraint for a port is made too small, then the synthesizer program will have to spend too much time trying to synthesize a circuit which meets the constraint; and that adds to the cost of the synthesis. Further, if a port timing constraint is too small, the synthesizer program may not be able to synthesize a circuit which meets the constraint, in which case the synthesizer program will eventually stop trying and simply report the failure.

Also, whenever the timing constraint for a first port on one module is too small, then it follows that the timing constraint for a second port on another module which is connected to the first port will be too large. This large constraint is a problem because synthesizer programs work on meeting the timing constraint of just one port at a time; and they sequentially select the port which has the worst timing constraint violation. Thus, when the timing constraint for the second port is too large, the synthesizer program will never even select the second port and try to speed up the circuitry which connects to it. Instead, the synthesizer program will only try to speed up the circuitry which connects to the first port where the timing constraint is too small. Consequently, the probability that the synthesized circuits will generate and process the intermodule signal on the first and second ports within the cycle time of the clock is greatly reduced.

Accordingly, a primary object of the present invention is to provide a novel method of fabricating an integrated circuit chip by which the above problems are overcome.

BRIEF SUMMARY OF THE INVENTION

In accordance with the present invention, an integrated circuit chip is fabricated as several circuit modules that are synchronized with a clock signal, by the following steps. Initially, a hardware description language is used to describe a functional behavior for a first module on the chip which generates an intermodule signal, and describe a functional behavior for a second module on the chip which processes the intermodule signal. Thereafter, a slow circuit embodiment of the first module is synthesized with port timing constraints which permit the intermodule signal to be generated in twice the cycle time $T_{CY}$ of the clock signal, and a slow circuit embodiment of the second module is synthesized with port timing constraints which permit the intermodule signal to be processed in twice the cycle time of the clock. Then, a timing analysis program is run on the slow circuit embodiment of the first and second modules to thereby obtain a first delay $\Delta_1$ in which the intermodule signal is actually generated, and obtain a second delay $\Delta_2$ in which the intermodule signal is actually processed. Subsequently, a fast circuit embodiment of the first module is synthesized which generates the intermodule signal within a delay of $(T_{CY})(\Delta_1) \div (\Delta_1 + \Delta_2)$ and a fast circuit embodiment of the second module is synthesized which processes the intermodule signal within a delay of $(T_{CY})(\Delta_2) \div (\Delta_1 + \Delta_2)$. Then, a storage media is embedded with computer readable code from which the fast circuit embodiment of the first and second modules is fabricated.

One important feature of the above described process is that the timing constraint for each port in the fast circuit embodiment is set equal to one clock cycle times a particular ratio of the actual time delays which occur in the slow circuit embodiment. This particular ratio of the actual time delays is significant because when an intermodule signal is generated (or processed) by a slow circuit embodiment with a large actual time delay, that indicates that the corresponding function which is being performed is relatively complex. Thus, a proportionately large amount of time is likely to be needed in the fast circuit embodiment to perform the complex function. Similarly, when an intermodule signal is generated (or processed) by a slow circuit embodiment with a small actual time delay, that indicates that the function which is being performed is relatively simple. Thus, a proportionately small amount of time is likely to be needed in the fast circuit embodiment to perform the simple function.

In the above ratio, the numerator is the actual time delay which the slow circuit embodiment of one module uses to generate (or process) a signal, and the denominator is the actual time delay which the slow circuit embodiment of two modules together use to both generate and process the same signal. Thus, the amount of time which a module uses to generate (or process) a signal, as a percentage of the total time which is taken to both generate and process the same signal, remains the same in both the slow circuit embodiment and the fast circuit embodiment of the module.

Another important feature of the above described process is that the timing constraints for all of the ports on all of the modules can be fully automated. This is important because the total number of ports on all of the modules of an actual integrated circuit is typically so large that it is virtually impossible for an individual to assign timing constraints to all of those ports, properly.

DETAILED DESCRIPTION

Figure 1:
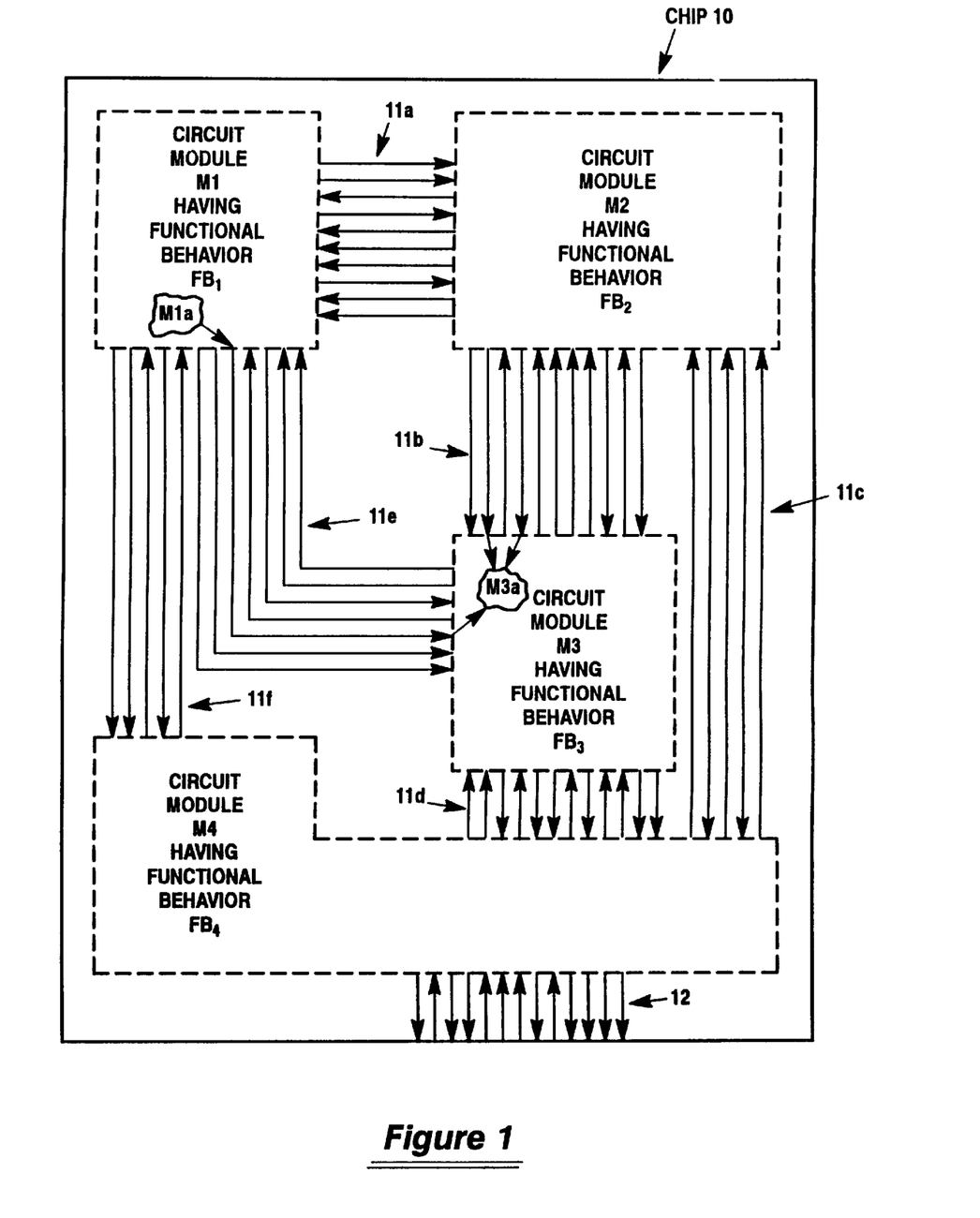
FIG. 1 shows a hypothetical integrated circuit chip which is greatly simplified to help explain the present invention.

Referring now to FIG. 1, it shows a hypothetical integrated circuit chip 10 which contains four circuit modules M1–M4. This chip 10 has a much simpler structure than the typical structure of an actual integrated circuit chip, and thus it is useful in explaining how actual chips are fabricated in accordance with the present invention without making the explanation overly complex.

At the start of the fabrication process, a particular functional behavior for each of the circuit modules M1–M4 is defined with a hardware description language. This is illustrated in FIG. 1 wherein module M1 has a functional behavior $FB_1$; module M2 has a functional behavior $FB_2$; module M3 has a functional behavior $FB_3$; and module M4 has a functional behavior $FB_4$.

Figure 2:
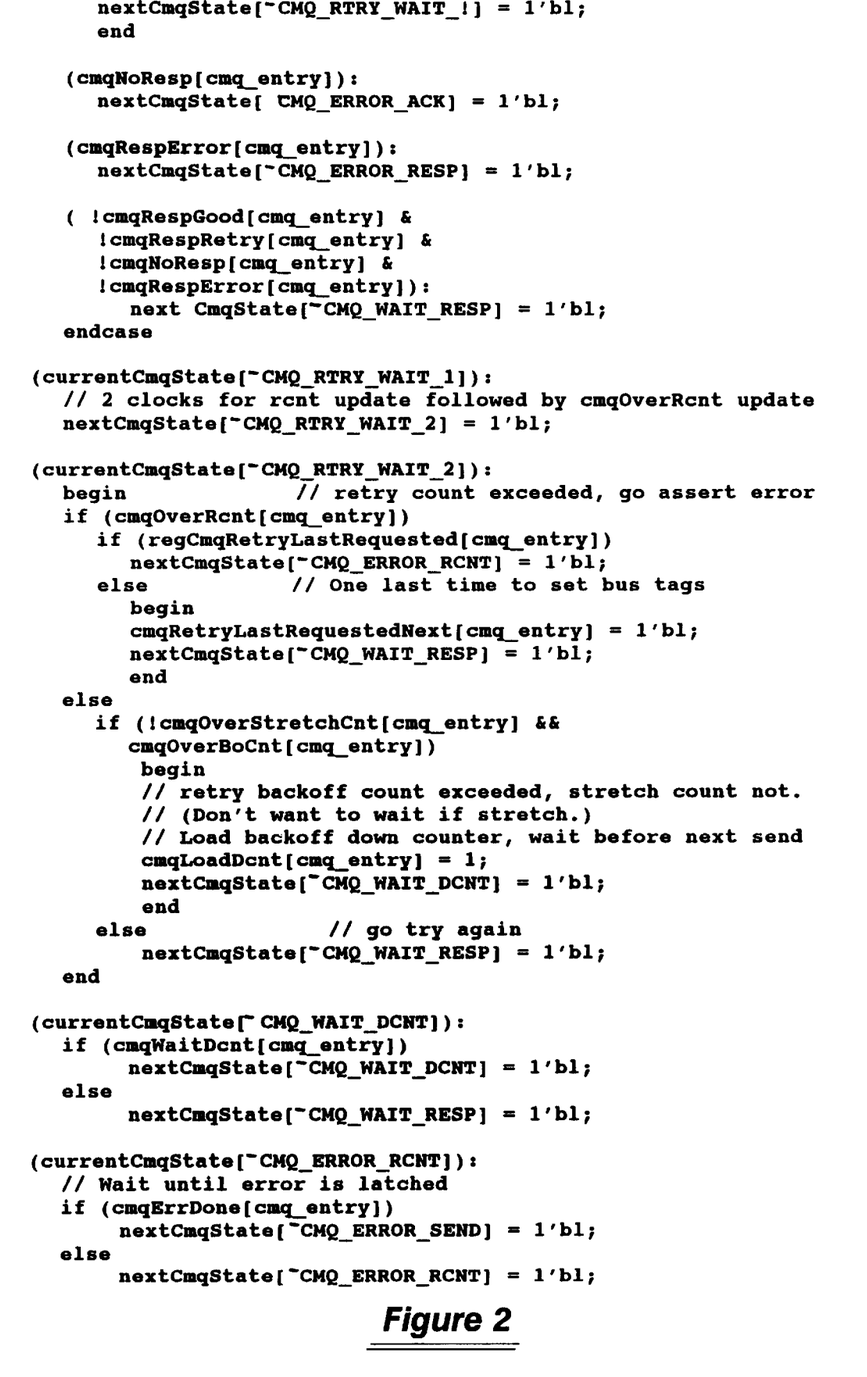
FIG. 2 shows an example of how the functional behavior for one module in the chip of FIG. 1 is defined with a hardware description language.

A specific example of how the functional behavior of a module is defined with a hardware description language is shown in FIG. 2. There, the functional behavior is written with a hardware description language called Verilog, and the illustrated behavior covers just a very small portion of only one module in an actual chip. In FIG. 2, the functional behavior is only forty-nine lines long. But the functional behavior for the entire module is over four thousand lines long; and a total of twelve modules of similar complexity exist on the chip.

Each circuit module in any actual integrated circuit chip typically is coupled with hundreds of signal lines to the other modules. This complexity is greatly simplified in FIG. 1 because in the Figure, hundreds of signal lines cannot be drawn. FIG. 1 shows just a few signal lines 11a–11f for carrying intermodule signals between the modules M1–M4. Also FIG. 1 shows just a few signal lines 12 for carrying external signals into and off of the chip.

Figure 3:
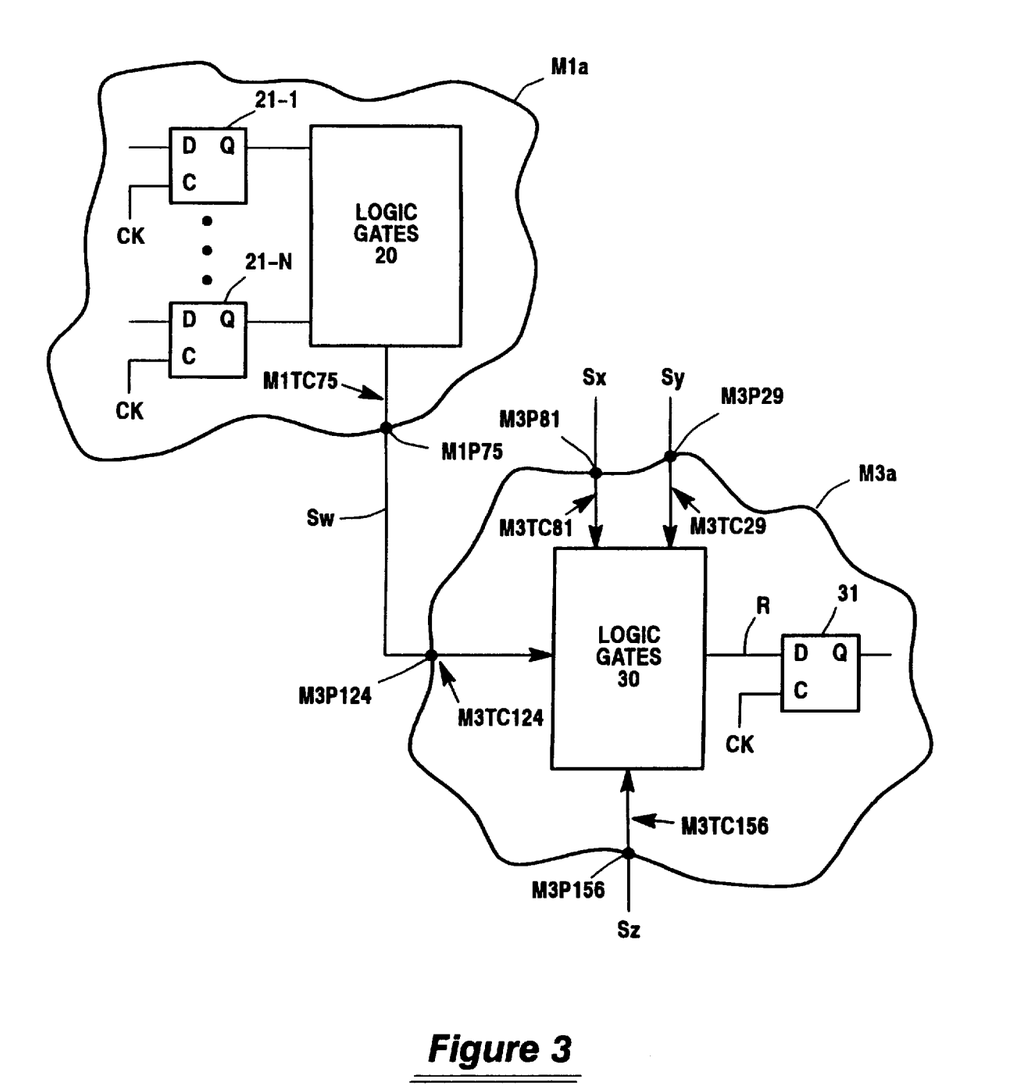
FIG. 3 shows, in greater detail, respective portions of two particular modules in the chip of FIG. 1.

All of the intermodule signals enter and exit the modules M1–M4 via named ports on the modules. An example of these named ports is shown in FIG. 3 where a portion M1a of module M1 generates an intermodule signal $S_W$ on port M1P75, and a portion M3a of module M3 receives the signal $S_W$ on port M3P124. Port M1P75 is the seventy-fifth port on module M1; and the port M3P124 is the one hundred twenty-fourth port on module M3.

Three other ports M3P81, M3P29, and M3P156 on module portion M3a are also shown in FIG. 3. Port M3P81 is the eighty-first port on module M3, and it receives an input signal $S_X$ from module M2. Port M3P29 is the twenty-ninth port on module M3, and it receives an input signal $S_Y$ from module M2. Port M3P156 is the one hundred fifty-sixth port on module M3, and it receives an input signal $S_Z$ from module M4.

To generate the signal $S_W$, module portion M1a contains a block of logic gates 20 which logically combines the signals from several D-type flip-flops 21-1 thru 21-N. These flip-flops synchronously change state in response to each rising edge of a clock signal CK. A portion of module M2 (not shown) contains similar circuitry to synchronously generate the signals $S_X$ and $S_Y$, and a portion of modules M4 (not shown) also contains similar circuitry to synchronously generate the signal $S_Z$. Module portion M3a processes the four input signals $S_W$–$S_Z$ with logic gates 30 and stores the result in a D-type flip-flop 31 which also synchronously changes state in response to the clock signal CK.

In order to automatically convert the functional behaviors $FB_1$–$FB_4$ to circuits by running a synthesizer program, each port on every module M1–M4 must first be assigned a respective timing constraint. An example of these timing constraints is shown in FIG. 3 where port M1P75 is assigned timing constraint M1TC75; port M3P124 is assigned timing constraint M3TC124; port M3P29 is assigned timing constraint M3TC29; and port M3P156 is assigned timing constraint M3TC156.

For each output port, the timing constraint specifies the amount of time which a synthesized circuit can use to generate a stable signal on the output port. Thus in FIG. 3, the timing constraint M1TC75 specifies the amount of time which can pass between the clocking of signals into the flip-flops 21-1 thru 21-N and the generation of a stable output signal on port M1P75.

For each input port, the timing constraint specifies the amount of time which a synthesized circuit can use to process a signal from the input port and store the result in a clocked flip-flop. Thus, in FIG. 3, the timing constraint M3TC124 specifies the amount of time which can pass between the occurrence of a stable signal $S_W$ on port M3P124 and the storing of a processed result R in flip-flop 31.

Since all of the circuit modules in an actual chip together have hundreds of ports, the task of specifying proper timing constraints for all of those ports is horrendous. If the timing constraint for a port is made too small, then the synthesizer program will have to spend too much time trying to synthesize a circuit which meets the constraint; and that adds to the cost of the synthesis. Further if a port timing constraint is too small, the synthesizer program may not be able to synthesize a circuit which meets the constraint, in which case it will simply stop trying and report the failure.

Also, whenever the timing constraint for a first port on one module is too small, then it follows that the timing constraint for the second port on another module which is connected to the first port will be too large. This large constraint is a problem because synthesizer programs work on meeting the timing constraint of just one port at a time; and they sequentially select the port which has the worst timing constraint violation. Thus, when the timing constraint for the second port is too large, the synthesizer program will never even select the second port and try to speed up the circuitry which connects to it. Instead, the synthesizer program will only try to speed up the circuitry which connects to the first port where the timing constraint is too small.

Figure 4:
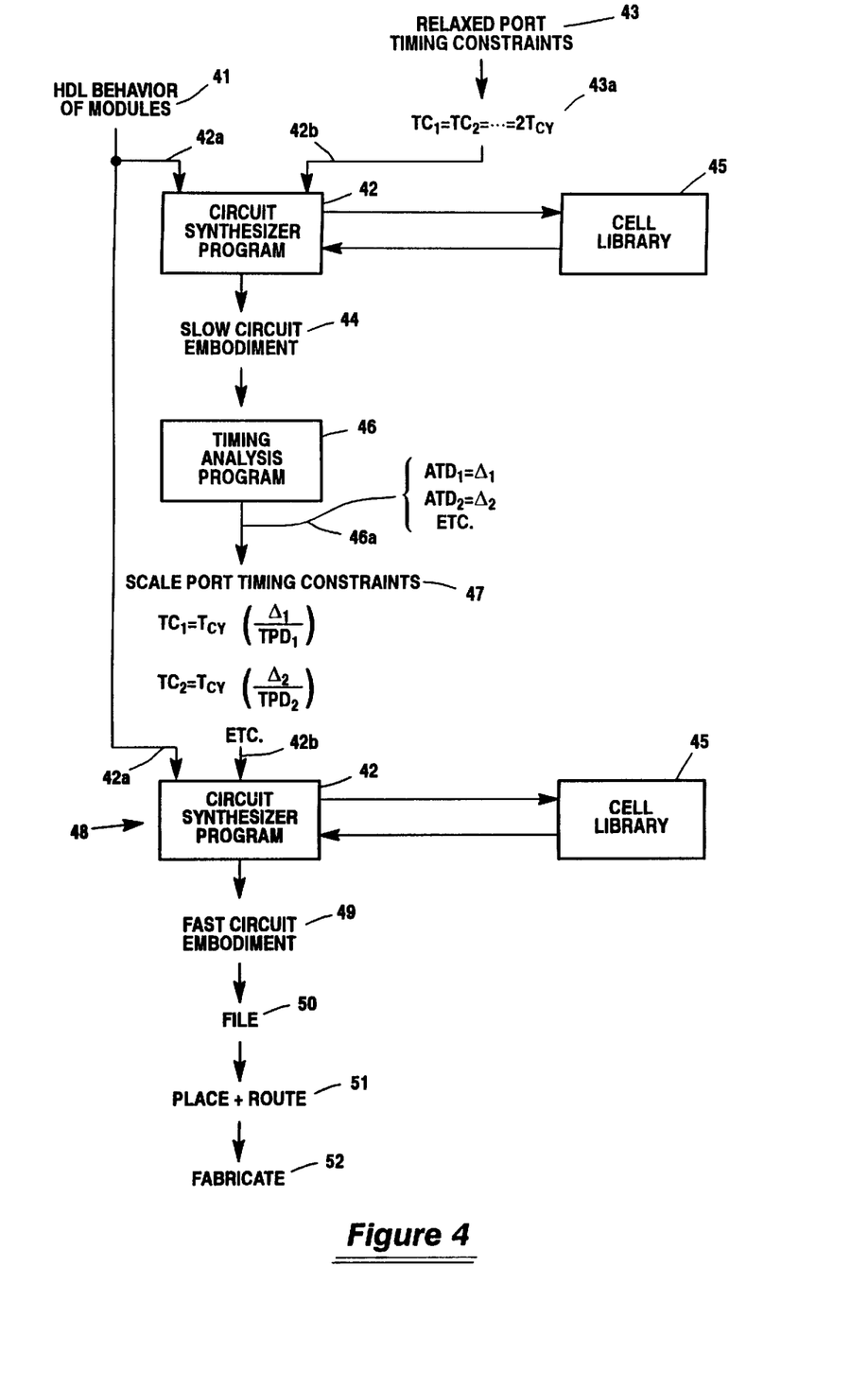
FIG. 4 shows all of the steps of a preferred process by which modules in FIG. 3 are fabricated in accordance with the present invention.

Now, in accordance with the present invention, the above problems are avoided by the process of FIG. 4. Initially in FIG. 4, step 41 is performed wherein the functional behavior of the circuit modules M1–M4 is defined with a hardware description language (HDL). This functional behavior is sent to one input 42a of a circuit synthesizer program 42.

Next in the process of FIG. 4, step 43 is performed whereby a set of relaxed timing constraints for all of the ports on all of the modules are defined. An example of this step is identified by reference numeral 43a. There, the relaxed timing constraint for each port on each module is set to twice the cycle time $T_{CY}$ of the clock signal CK. By comparison, in the chip that will be produced when the FIG. 4 process is complete, the sum of the timing constraints for each pair of ports that are connected must be within a single clock cycle. All of the relaxed timing constraints 43a are sent to a second input 42b of the circuit synthesizer program 42.

Next in the FIG. 4 process, the circuit synthesizer program 42 is run to thereby generate a slow circuit embodiment 44 of each of the modules which have their functional behavior described on input 42a. In performing this step, the circuit synthesizer program 42 selects particular circuits from a cell library 45 and interconnects those circuits such that the modules perform their functional behaviors within the time constraints that are specified on input 42b. This step of generating the slow circuit embodiment 44 is easily completed by the circuit synthesizer program 42 because the timing constraints on input 42b are so relaxed.

Next in the FIG. 4 process, a timing analysis program 46 is run on the slow circuit embodiment 44. This step determines the actual time delays with which the intermodule signals are generated on each output port by circuitry such as that which is shown in module portion M1a of FIG. 3; and this step also determines the actual time delays with which the intermodule signals on each input port are processed by circuitry such as that which is shown in module portion M3a of FIG. 3.

These actual time delays (ATD) are identified by reference numeral 46a in FIG. 4. There, the actual time delay of an intermodule signal on a first port is abbreviated as $ATD_1$ and its value is equal to $\Delta_1$. Similarly, the actual time delay of an intermodule signal on a second port is abbreviated as $ATD_2$ and its value is equal to $\Delta_2$; etc.

Next in the FIG. 4 process, step 47 is performed wherein a new set of port timing constraints is generated by utilizing the above actual time delays $\Delta_1$, $\Delta_2$, etc. In step 47, the timing constraint $TC_i$ for the i-th port on a module X is set equal to the cycle time $T_{CY}$ of the clock CK times a scale factor of $\Delta_i \div TPD_i$. Here, $\Delta_i$ is the actual time delay for the intermodule signal on the i-th port of module X as determined by step 45; and $TPD_i$ is the total path delay, as defined below, for that same signal.

If the i-th port of module X is an output port, then the total path delay $TPD_i$ equals the actual time delay with which module X generates a signal on the i-th port plus the actual time delay with which that same signal is processed by another module Y. Similarly, if the i-th port of module X is an input port, then the total path delay $TPD_i$ equals the actual time delay with which module X processes a signal on the i-th port plus the actual time delay with which that same signal is generated by another module Y.

Next in the FIG. 4 process, step 48 is performed wherein the circuit synthesizer program 42 is run for a second time. In step 48, input 42a to the synthesizer program receives the same functional behavior 41 of the modules that was previously used to synthesize the slow circuit embodiments 44. However, in step 48, input 42b to the circuit synthesizer program receives the scaled port timing constraints that are generated by step 47.

In performing step 48, the circuit synthesizer program 42 selects particular circuits from the cell library 45 and interconnects those circuits such that the modules perform their functional behaviors within the time constraints that are specified on input 42b. This synthesis generates a fast circuit embodiment 49 of the modules; and it is stored as computer readable code in a file 50.

Thereafter, all of the cells in the fast circuit embodiment 49 are assigned physical locations on an integrated circuit chip, and all of the signals which interconnect those cells are assigned particular routes on the chip. This is achieved by running a conventional "place and route" program 51 on the file 50. Following these steps, the actual integrated circuit chip is fabricated by any conventional chip fabrication process 52.

Figure 5:
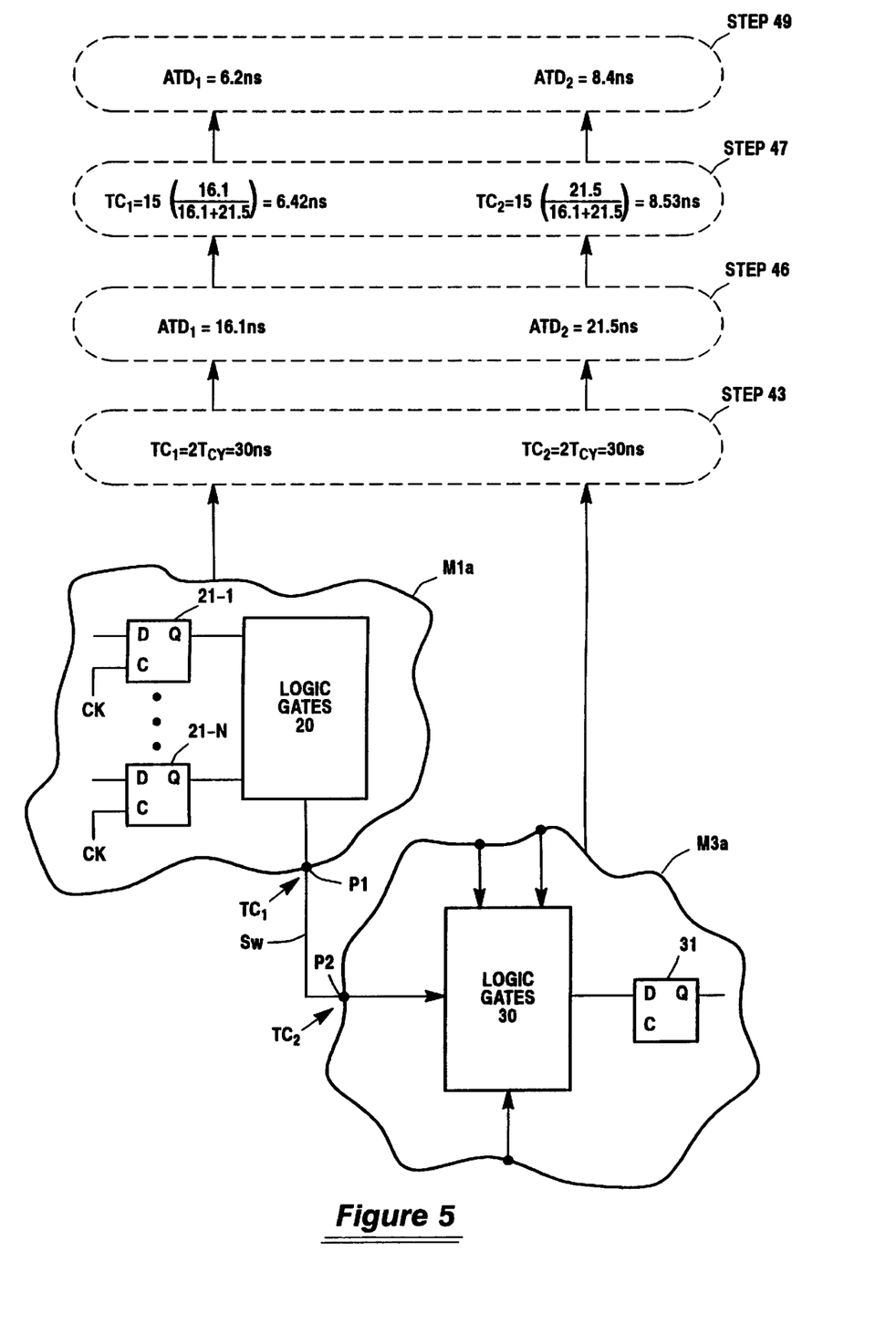
FIG. 5 shows an example of the results which are obtained as some of the steps of the FIG. 4 process are applied to the portions of the two modules that are shown in FIG. 3.

A numerical example of the above described FIG. 4 process is illustrated in FIG. 5. This numerical example applies to portion M1a of module M1 and portion M3a of module M3, which are reproduced in the bottom of FIG. 5. In this reproduction, the two ports which carry the signal $S_W$ are relabeled as P1 and P2 for simplicity; and the corresponding timing constraints on those ports are also relabeled as $TC_1$ and $TC_2$. The remaining portion of FIG. 5 shows a numerical example of the results which are obtained when steps 43, 46, 47, and 49 of the FIG. 4 process are applied to the module portions M1a and M3a.

By step 43 in FIG. 5, a relaxed set of timing constraints is assigned to port P1 of module portion M1a and port P2 of module portion M3a. Here, the clock cycle time $T_{CY}$ is assumed to equal fifteen nanoseconds (ns). Thus, the timing constraint $TC_1$ on port P1 is set equal to twice the clock cycle time, or thirty nanoseconds; and the timing constraint $TC_2$ on port P2 of module portion M3a is also set equal to thirty nanoseconds.

Thereafter, a slow circuit embodiment of the module portions M1a and M3a is synthesized such that the above thirty nanosecond timing constraints are met; and then a timing analysis program is run on that slow circuit embodiment. This determines the actual time delay $ATD_1$ with which the intermodule signal $S_W$ is generated on port P1, and the actual time delay $ATD_2$ with which the intermodule signal $S_W$ on input port P2 is processed. In the FIG. 5 example, step 46 shows an actual time delay $ATD_1$ of 16.1 nanoseconds, and an actual time delay $ATD_2$ of 21.5 nanoseconds.

Next, step 47 is performed wherein the actual time delays $ATD_1$ and $ATD_2$ are used to generate a new set of timing constraints for the ports P1 and P2. By this step 47, the new timing constraint for port P1 is set equal to the clock cycle time of fifteen nanoseconds times the scale factor of $ATD_1$ divided by the sum of ($ATD_1+ATD_2$). Similarly, the new timing constraints for port P2 is set equal the clock cycle time of fifteen nanoseconds divided by a scale factor of $ATD_2$ divided by the sum of ($ATD_1+ATD_2$).

Next, step 49 is performed wherein the new timing constraints of step 47 are sent as inputs to the circuit synthesizer program to thereby obtain a fast circuit embodiment of the module portions M1a and M3a. Then, a timing analysis program is run on those fast circuit embodiments to determine the actual time delay with which the intermodule signal $S_W$ is generated by module portion of M1a and processed by module portion M3a. In the numerical example of FIG. 5, signal $S_W$ is generated by module portion M1a in 6.2 nanoseconds; and signal $S_W$ is processed by module portion M3a in 8.4 nanoseconds.

An important feature of the above described process of FIGS. 4 and 5 is the manner in which the port timing constraints for the fast circuit embodiment are selected by step 47. In that step, the timing constraints for each port in the fast circuit embodiment is set equal to one clock cycle times a particular ratio of the actual time delays which occur in the slow circuit embodiment.

This particular ratio of the actual time delays which occurs in step 47 can be explained as follows. When an intermediate signal is generated (or processed) by a slow circuit embodiment with a large actual time delay, that indicates that the corresponding function which is being performed is relatively complex and thus needs a proportionately large amount of time to complete in the fast circuit embodiment. Similarly, when an intermodule signal is generated (or processed) by a slow circuit embodiment with a small actual time delay, that indicates that the function which is being performed is relatively simple and only needs a proportionately small amount of time to complete in the fast circuit embodiment.

Now, with the ratio in step 47, the numerator is the actual time delay which the slow circuit embodiment of one module uses to generate (or process) a signal, and the denominator is the actual time delay which the slow circuit embodiment of two modules together use to both generate and process the same signal. Thus, by step 47, the amount of time which a module uses to generate (or process) a signal, as a percentage of the total time which it takes to both generate and process the same signal, remains the same in both the slow circuit embodiment and the fast circuit embodiment of the module.

Through experimentation, the present inventors have found that the port constraints for the fast circuit embodiment, as determined by step 47 of FIG. 4, have a high probability of being neither too small nor too large. This means that for each pair of ports on two different modules which are connected by an intermodule signal, the probability is high that the synthesizer program will select both such ports and try to speed-up the circuitry which connects to both ports.

Another important feature of the above described process of FIGS. 4 and 5 is that the timing constraints for all of the ports on all of the modules, as selected by steps 43 and 47, can be fully automated. This is important because the total number of ports on all of the modules of an actual integrated circuit is typically so large that it is virtually impossible for an individual to assign timing constraints to all of those ports properly.

One preferred process for practicing the present invention has now been described in detail. In addition, however, many changes and modifications can be made to this preferred process without the departing from the nature and spirit of the invention.

As one modification, the step of defining a particular functional behavior for each of the circuit modules can be performed by using any conventional hardware description language, and not just the Verilog language which is illustrated in FIG. 2. For example, the hardware description language called VHDL can be used.

Figure 6A:
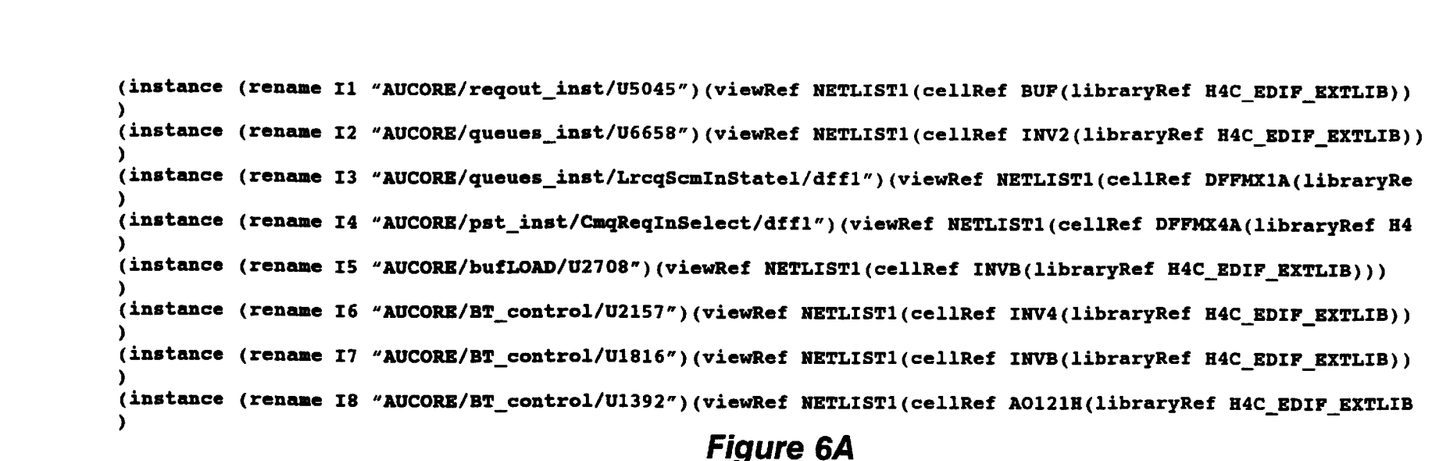
FIGS. 6A and 6B show one format for a computer-readable code that is produced by the FIG. 4 process, and from which an actual chip can be fabricated.
Figure 6B:
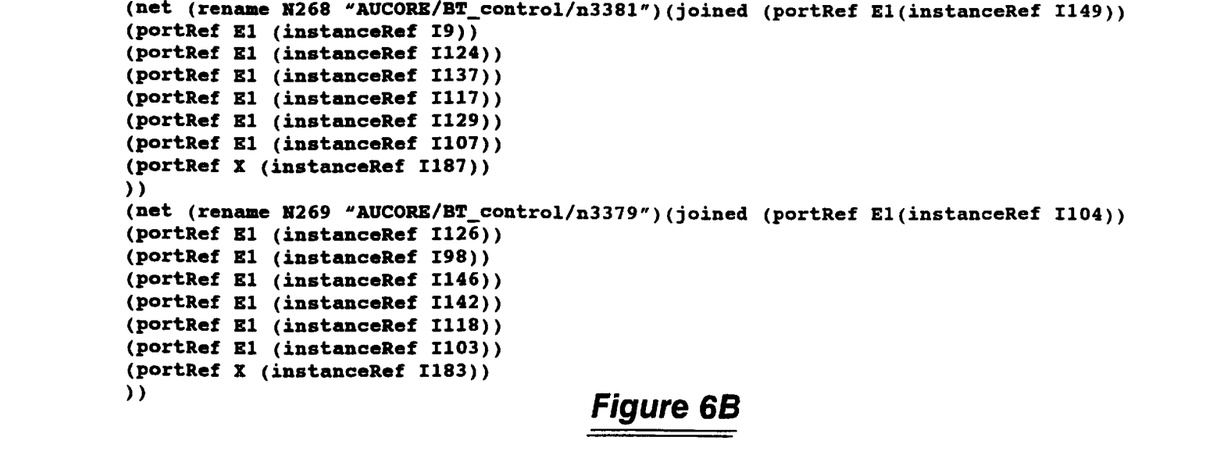

As another modification, the step of storing the fast circuit embodiment 49 in the FIG. 4 process as computer readable code can be performed by utilizing a variety of formats for the stored code. One particular example of the EDIF format for this code is shown in FIGS. 6A and 6B. In FIG. 6A, each particular cell which is selected from the cell library and incorporated into the fast circuit embodiment of a module is listed as a separate item. In FIG. 6B, each signal which occurs in a module is listed as a separate item together with all of the cells from the cell library which receive or generate that signal. For an actual integrated circuit chip, the code that is shown in FIGS. 6A or 6B will typically be several thousand lines long. Preferably, the file 50 on which this computer-readable code is stored is either a magnetic disc or a magnetic tape.

As another modification, the circuit synthesizer program 42 can be any program which synthesizes circuits that receives as an input the port timing constraints. For example, the circuit synthesizer program 42 can be the Synopsys Design Compiler or the Synopsys Behavioral Compiler.

As another modification, the relaxed port timing constraints which are imposed by step 43 of the FIG. 4 process can be different than the particular set of constraints which are indicated in FIG. 4 by reference numeral 43a. For example, the relaxed port timing constraints can allow each circuit module to use at least one entire clock cycle to either generate or process an intermodule signal. Alternatively, the relaxed port timing constraints can allow any two circuit modules which respectively generate and process a particular intermodule signal to together complete that operation in a time interval which is at least 50% longer than one clock cycle time. As another alternative, the Synopsys Design Compiler has a switch that selects a certain amount of effort which the synthesizer program uses while trying to synthesize a circuit with a particular port timing constraint. This amount of effort can be selected as low, medium or high to progressively increase the number and complexity of circuit optimization steps which the synthesizer is allowed to use. When such a synthesizer program is used in the FIG. 4 process, then the optimization effort which is selected to synthesize the slow circuit embodiment should be the minimal effort that is available, and the timing constraint which is imposed should be so relaxed that it can be met by the synthesizer program even while the minimum optimization effort is imposed.

Figure 7A:
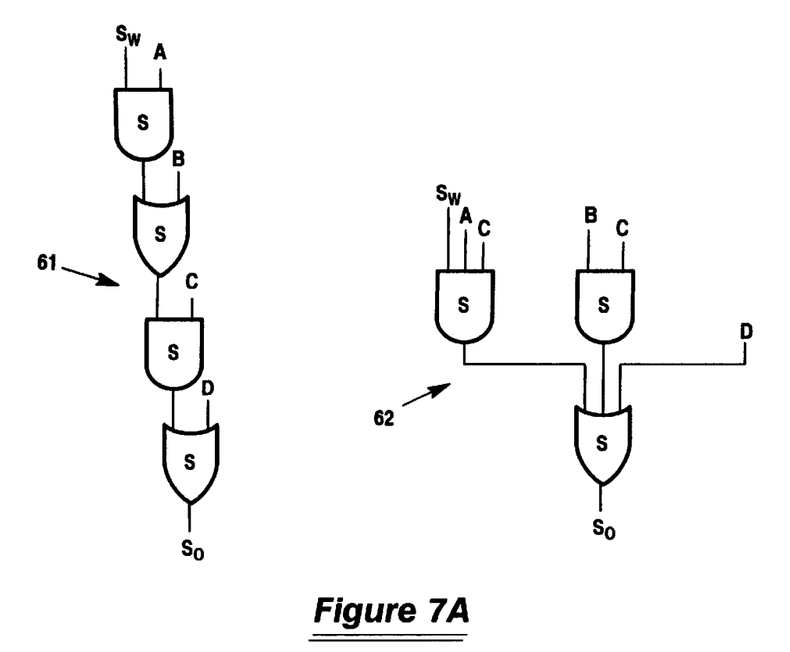
FIGS. 7A, 7B and 7C show respective performance enhancing substeps which can be performed by the FIG. 4 process to help generate the computer-readable code of FIGS. 6A and 6B.

Also as another modification, a variety of performance enhancing substeps can be performed by the circuit synthesizer program in order to make the synthesized circuit meet all of its port timing constraints. For example, if the slow circuit embodiment of a module includes a multi-level chain of logic gates which receives an intermodule signal at a certain logic level, then the step of synthesizing the fast circuit embodiment can include the substep of reducing the level in the logic chain at which the intermodule signal is received. This is shown in FIG. 7A. There, reference numeral 61 shows a chain of four logic gates which combine the intermodule signal $S_W$ with four other signals A-D, and in which the intermodule signal $S_W$ is received at the fourth logic level in the chain. By comparison, reference numeral 62 shows a different chain of logic gates which generates the same output signal $S_O$ as the chain 61, and in which the intermodule signal $S_W$ is received at the second level of the chain.

Figure 7B:
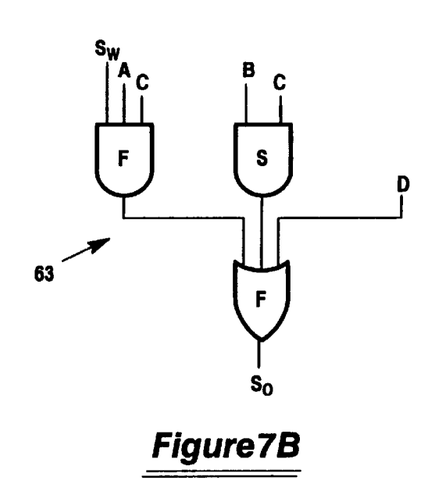

Similarly, if the slow circuit embodiment includes several slow speed logic gates which are selected from the cell library, then the step of synthesizing the fast circuit embodiment can include the substep of replacing one or more slow speed logic gates with higher speed logic gates from the cell library. This is shown in FIG. 7B. There, reference numeral 63 identifies the same chain of logic gates as the chain 62 in FIG. 7A, with the exception that two of the logic gates in FIG. 7B operate faster than the logic gates in FIG. 7A. These two fast logic gates are identified by the letter F in FIG. 7B, and the slower logic gates are identified by the letter S in FIG. 7A.

Figure 7C:
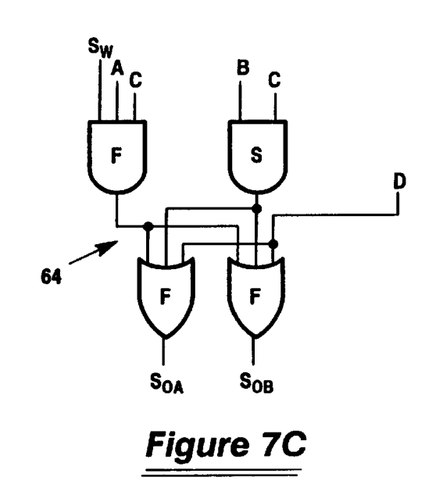

Further, if the slow circuit embodiment of the modules includes a particular logic gate which drives multiple loads, then the step of synthesizing the fast circuit embodiment of the modules can include the substep of replacing that particular logic gate with two logic gates which share in the driving of the multiple loads. This is shown in FIG. 7C. There, reference numeral 64 identifies the same chain of logic gates that is shown in FIG. 7B, with the exception that in FIG. 7C, two output signals $S_{OA}$ and $S_{OB}$ are generated which duplicate the signal $S_O$. Signal $S_{OA}$ can drive some of the loads which are driven by the signal $S_O$ and signal $S_{OB}$ can drive the remaining loads.

As another modification, the timing constraints for the ports on all of the circuit modules can be sent to the circuit synthesizer program in a different format. For example, instead of each timing constraint specifying the amount of time that can be used within a module, each timing constraint can specify the amount of time which is allocated for use outside of the module. With this modification, the scaled timing constraints for the i-th port is step 47 is expressed as $TC_i = T_{CY} - [T_{CY}(\Delta_i \div TPD_i)]$.

As another modification, the D-type triggerable flip-flops 21-1 thru 21-N and 31 of FIG. 3 which synchronously change state in response to each rising edge of the clock signal CK can be replaced with any other type of flip-flop. For example, the flip-flops 21-1 thru 21-N and 31 can be latch-type flip-flops where each such latch changes state in response to the high level of the clock signal CK, rather than in response to the rising edge of the clock signal. Also, either type of flip-flop can be incorporated into a larger component, such as a RAM, CAM, or ROM.

Accordingly, it is to be understood that the present invention is not limited to the details of any one particular embodiment as described above, but is defined by the appended claims along with their full scope of equivalents.

What is claimed is:

1. A method, for use in fabricating an integrated circuit chip as several circuit modules that are synchronized with a clock signal having a cycle time $T_{CY}$; said method including the steps of:

describing with a hardware description language, a functional behavior for a first module on said chip which generates an intermodule signal, and a functional behavior for a second module on said chip which processes said intermodule signal;

synthesizing a slow circuit embodiment of said first module and a slow circuit embodiment of said second module which together take longer than said cycle time $T_{CY}$ to generate and process said intermodule signal;

running a timing analysis program on said slow circuit embodiment of said first and second modules to thereby obtain a first delay $\Delta_1$ in which said intermodule signal is generated, and a second delay $\Delta_2$ in which said intermodule signal is processed;

synthesizing a fast circuit embodiment of said first module which generates said intermodule signal within a delay of $(T_{CY})(\Delta_1) \div (\Delta_1 + \Delta_2)$ and synthesizing a fast circuit embodiment of said second module which processes said intermodule signal within a delay of $(T_{CY})(\Delta_2) \div (\Delta_1 + \Delta_2)$; and, producing a storage media on which computer readable code is embedded for fabricating said fast circuit embodiment of said first and second modules.

2. A method according to claim 1 where within said step of synthesizing said slow circuit embodiment of said first and second modules, a relaxed timing constraint is imposed which allows said first module to use at least one entire clock cycle to generate said intermodule signal, and allows said second module to also use at least one entire clock cycle to process said intermodule signal.

3. A method according to claim 1 where within said step of synthesizing said slow circuit embodiment of said first and second modules, a relaxed timing constraint is imposed which allows said first and second modules to together generate and process said intermodule signal in a time interval that is at least fifty percent longer than said clock cycle time.

4. A method according to claim 1 where within said step of synthesizing said slow circuit embodiment of said first and second modules, an optimization effort is imposed which is a minimal effort that is available from a set of selectable efforts, and a timing constraint is imposed which is so relaxed that it can be met by said minimal optimization effort.

5. A method according to claim 1 wherein said slow circuit embodiment of said first and second modules includes a logic gate which drives multiple loads, and wherein the step of synthesizing said fast circuit embodiment of said first and second modules includes the substep of replacing said logic gate with two logic gates which share in the driving of said multiple loads.

6. A method according to claim 1 wherein said slow circuit embodiment of said first and second modules includes a logic gate which receives said intermodule signal at a certain level in a multi-level logic chain, and wherein said step of synthesizing said fast circuit embodiment of said first and second modules includes the substep of reducing the level in said logic chain at which said intermodule signal is received.

7. A method according to claim 1 wherein said slow circuit embodiment of said first and second modules includes several slow speed logic gates, and wherein the step of synthesizing said fast circuit embodiment of said first and second modules includes the substep of replacing said slow speed logic gates with higher speed logic gates.

8. A method according to claim 1 wherein said first module begins the generation of said intermodule signal by reading a stored signal from one flip-flop in said first module, and said second module ends the processing of said intermodule signal by storing a result in another flip-flop in said second module, where each flip-flop changes state in response to one edge of said clock signal.

9. A method according to claim 1 wherein said first module begins the generation of said intermodule signal by reading a stored signal from one latch in said first module, and said second module ends the processing of said intermodule signal by storing a result in another latch in said second module, where each latch changes state in response to one level of said clock signal.

10. A method according to claim 1 wherein said producing step includes the substep of writing said computer readable code on a magnetic disc.

11. A method according to claim 1 wherein said producing step includes the substep of writing said computer readable code on a magnetic tape.

12. A method according to claim 1 and further including the additional step of fabricating said integrated circuit chip with said fast circuit embodiments of said first and second modules integrated therein.

* * * * *